United States Patent [19]
Paoli

[11] Patent Number: 5,305,412
[45] Date of Patent: Apr. 19, 1994

[54] SEMICONDUCTOR DIODE OPTICAL SWITCHING ARRAYS UTILIZING LOW-LOSS, PASSIVE WAVEGUIDES

[75] Inventor: Thomas L. Paoli, Los Altos, Calif.
[73] Assignee: Xerox Corporation, Stamford, Conn.
[21] Appl. No.: 990,142
[22] Filed: Dec. 14, 1992
[51] Int. Cl.$^5$ .............................................. G02B 6/00
[52] U.S. Cl. .................................... 385/122; 372/50; 385/24; 385/39; 385/40; 385/45; 385/50; 385/130
[58] Field of Search .............. 372/50, 46, 6; 385/14, 385/24, 27, 39, 40, 45, 48, 50, 129, 130, 122

[56] References Cited

U.S. PATENT DOCUMENTS

| | | | |
|---|---|---|---|
| 4,255,717 | 3/1981 | Scifres et al. | 372/50 |
| 4,369,513 | 1/1983 | Umeda et al. | 372/46 |
| 4,689,797 | 8/1987 | Olshansky | 372/45 |
| 4,717,228 | 1/1988 | Thylén | 385/14 |
| 4,760,580 | 7/1988 | Thompson et al. | 385/45 |
| 4,765,703 | 8/1988 | Suzuki et al. | 385/8 |
| 4,856,860 | 8/1989 | Silverberg et al. | 385/122 |
| 4,886,538 | 12/1989 | Mahapatra | 385/132 |
| 4,909,584 | 3/1990 | Imoto et al. | 385/16 |
| 5,003,550 | 3/1991 | Welch et al. | 372/50 |
| 5,016,960 | 5/1991 | Eichen et al. | 385/16 |
| 5,058,121 | 10/1991 | Paoli | 372/50 |
| 5,109,444 | 4/1992 | Handa et al. | 385/14 |
| 5,157,756 | 10/1992 | Nishimoto | 385/129 |
| 5,206,920 | 4/1993 | Cremer et al. | 385/37 |

OTHER PUBLICATIONS

J. Epler et al., "Dependence of Central-Lobe Output Power on Fill Factor of an In-phase Laser Array", *Electronics Letters*, 2nd Jul. 1987, vol. 23, No. 14, pp. 754–755.

M. Ikeda, "Tandem Switching Characteristics for Laser Diode Optical Switches", *Electronics Letters*, 14th Mar. 1985, vol. 21, No. 6, pp. 252–254.

H. Kataoka, "Laser-Diode Optical Switch Module", *Electron Letters*, 1984, vol. 20, pp. 438–439.

M. Ikeda, "Laser Diode Switch", *Electron Letters*, 1981, vol. 17, pp. 899–900.

*Primary Examiner*—Frank Gonzalez
*Attorney, Agent, or Firm*—William Propp

[57] ABSTRACT

Arrays of blocking optical switches formed from optically amplifying waveguides are used to transmit or block one or more input beams to one or more selected optical channels. Passive optical waveguides couple the optical input to the amplifying waveguides. Optical splitters monolithically formed with passive optical waveguides are used to route the optical signal from a single fiber to the array of amplifying waveguides.

24 Claims, 5 Drawing Sheets

SEMICONDUCTOR DIODE OPTICAL SWITCHING ARRAYS UTILIZING LOW-LOSS, PASSIVE WAVEGUIDES

BACKGROUND OF THE INVENTION

This invention relates to a monolithic semiconductor structure diode optical switching array, and, more particularly, to a multiple element semiconductor structure diode optical switching array with passive waveguides with wide bandgaps and weak optical confinement for improved coupling to amplification waveguides.

Multiple electrode optical switches are of interest for routing signals in optical communication systems, for line-printing elements in advanced xerographic printers, and potentially as modulators for high-speed coding of information.

Optical switching arrays route light beams on different paths, usually without adding any information to the beams. Optical modulating arrays add information to the light beams but do not change the routing of those beams.

It is an object of this invention to provide an optical modulating element with optical gain.

It is another object of this invention to use arrays of optically amplifying waveguides as blocking optical switches for routing one or more input beams to one or more selected optical channels.

It is yet another object of this invention to use arrays of optically amplifying modulators as pixel elements in a multi-electrode printbar.

It is a further object of this invention to integrate optically amplifying modulator arrays with beam splitting elements within a monolithic semiconductor structure to route one or more input optical beams to one or more selected optical channels.

SUMMARY OF THE INVENTION

In accordance with the present invention, within a monolithic semiconductor structure, passive waveguides couple amplification waveguides to input and output facets. Optical splitters can couple the passive waveguides from the input facet to the amplification waveguides. The amplification waveguides can couple the input and output facets directly.

Other objects and attainments together with a fuller understanding of the invention will become apparent and appreciated by referring to the following description and claims taken in conjunction with the accompanying drawings.

DESCRIPTION OF THE PREFERRED EMBODIMENT

Figure 1:
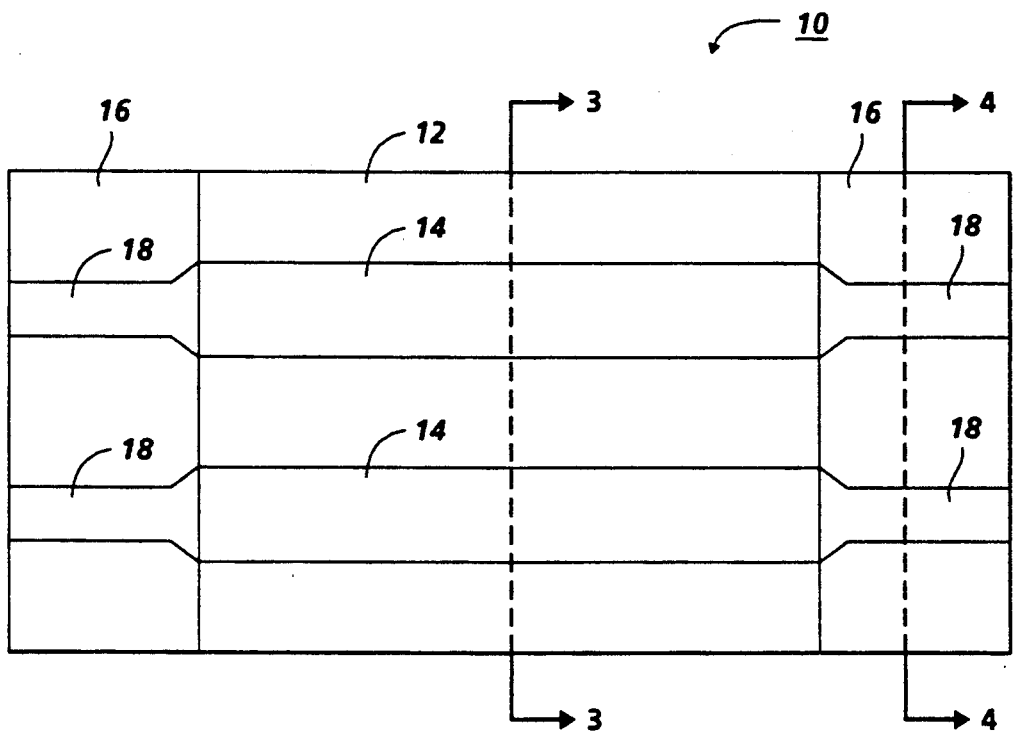
FIG. 1 is a schematic illustration of the top view of a semiconductor heterostructure with buried planar amplification optical waveguides and buried planar passive lowloss optical waveguides formed according to the present invention.
Figure 2:
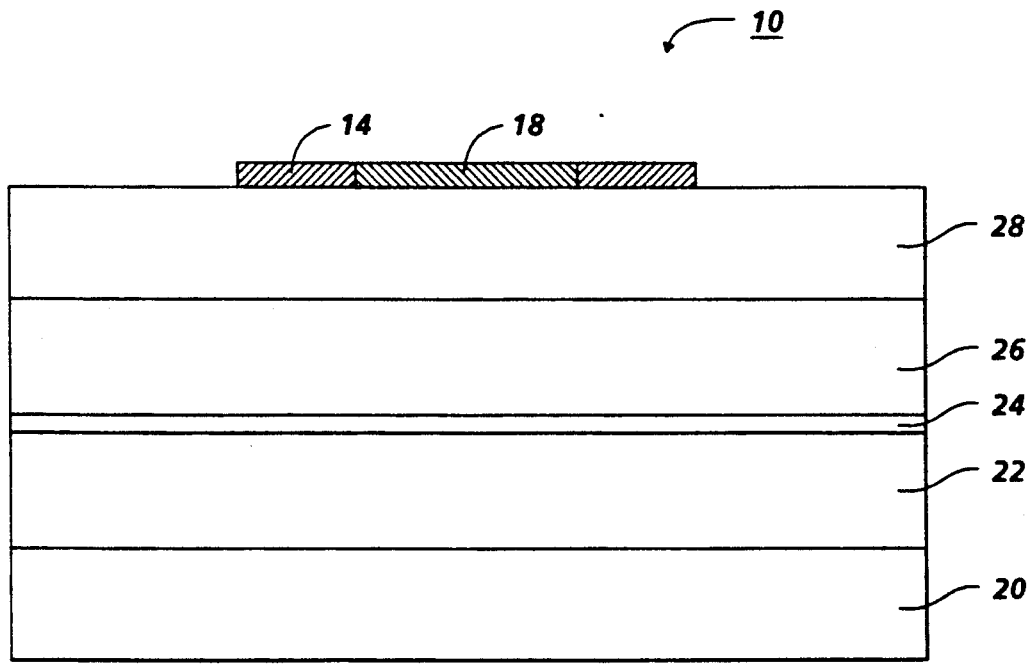
FIG. 2 is a schematic illustration of the end view of the semiconductor heterostructure with buried planar amplification optical waveguides and buried planar passive lowloss optical waveguides of FIG. 1 before selective impurity induced disordering formed according to the present invention.

Reference is now made to FIGS. 1 and 2, wherein there is illustrated a semiconductor heterostructure 10 with buried planar amplification optical waveguides and buried planar passive lowloss optical waveguides.

As shown in FIG. 1, the semiconductor heterostructure 10 has a central section 12 with a mask 14 for forming the buried planar amplification optical waveguides and end sections 16 with a mask 18 for forming the buried planar passive lowloss optical waveguides.

As a particular example, mask portion 14 may be typically about 4 μm wide and mask 18 may be typically 2 μm wide. However, the width dimensions of these mask portions are chosen in a manner as follows: (1) the wider dimensions of mask portion 14 is chosen to determine the width of the pumping stripe for the amplification optical waveguide of section 12 and (2) the narrower dimension of mask portion 18 is chosen to be sufficiently narrow to achieve some degree of impurity induced disordering substantially into if not through its active region portion beneath the mask such that the central core of its active region 24 is less completely interdiffused by the impurity induced disordering process as compared to the adjacent disordered regions of the active region 24 outside this central portion and not protected by mask portion 18.

As shown in FIG. 2, the semiconductor heterostructure 10 comprises a substrate 20 of n-GaAs upon which is epitaxially deposited a first cladding layer 22 of n-$Al_yGa_{1-y}As$ wherein $y \geq 0.40$; an active layer 24 of multiple quantum wells of four 12 nm quantum wells of $Ga_{1-x}Al_xAs$, wherein $x=0.05$, separated by three 6 nm barriers of $Ga_{1-z}Al_zAs$, wherein $z=0.20$, a second cladding layer 26 of p-$Al_yGa_{1-y}As$ wherein $y \geq 0.40$, and a cap layer 28 of p+GaAs. This monolithic semiconductor structure is a semiconductor heterostructure since the layers within the structure are different semiconductor materials.

The active layer 24 may, in the alternative, be non-doped or p-type doped or n-type doped; GaAs, $Al_zGa_{1-z}As$ where $y>z$ or $(Al_zGa_{1-z})_{0.5}In_{0.5}P$; or a relatively thin conventional double heterostructure (DH) active layer; or a single quantum well, such as GaAs or $Al_zGa_{1-z}As$ where $z<y$; or a multiple quantum well superlattice, such as alternating layers of GaAs and $Al_zGa_{1-z}As$ where $z<y$ or alternating layers of $Al_w$-$Ga_{1-w}As$ and $Al_BGa_{1-B}As$ where $w<B<y$ (w for well and B for barrier). Also, in the alternative, any of the aforementioned active layers can be deposited between two semiconductor confinement layers of $Al_m$-$Ga_{1-m}As$ and $Al_nGa_{1-n}As$, where $m=$ or $\neq n$, but with the bandgaps intermediate between the bandgaps of the active layer and the first and second cladding layers, in a separate confinement structure.

As is known in the art, the epitaxial growth of the semiconductor heterostructure 10 may be carried out by molecular beam epitaxy (MBE) or metalorganic chemical vapor deposition (MOCVD). The substrate 20 may be about 100 microns thick. The cladding layers 22 and 26 may have a thickness in the range of 0.1 to 1 micron. The active layer 24 may be a thin conventional layer having a thickness of 50 nanometers to 2 microns or may be comprised of a superlattice structure of quantum wells which may be 3 to 50 nanometers thick. This active region 24 of multiple quantum wells has a thickness of approximately 66 nm. The cap layer 28 is typically 0.1 to 0.2 microns thick.

There are alternate conventional techniques and diffusion/implant species for carrying out the desired disordering or the elemental implant/annealing technique to form the amplification waveguides and the passive waveguides. Discussion hereafter will be confined to impurity induced disordering. However, it should be noted that these other techniques and elemental diffusions or implants are equally applicable to form the amplification waveguides and the passive waveguides.

Upon completion of the epitaxial growth, masks 14 and 18 of $Si_3N_4$ are formed on the top surface of the cap layer 28 of the semiconductor heterostructure 10 with openings exposing regions of the semiconductor structure to impurity induced disordering. The masks protect the unexposed regions which will form and shape the amplification and passive optical waveguides.

The amplification and passive optical waveguides are established by first selectively diffusing a high concentration n-impurity dopant, such as silicon, into the regions of the semiconductor structure exposed through the mask. Other n-impurity dopant elements would include Ge and Sn.

A silicon layer is deposited in the opening in the $Si_3N_4$ mask and then capped with an additional layer of $Si_3N_4$. The diffusion of silicon is accomplished at a temperature of approximately 800° C. and is maintained for a sufficiently long period of time, e.g. seven to eight hours, to penetrate the cap layer 28, the second cladding layer 26 and the active layer 24, and partially penetrate the first cladding layer 22.

Figure 3:
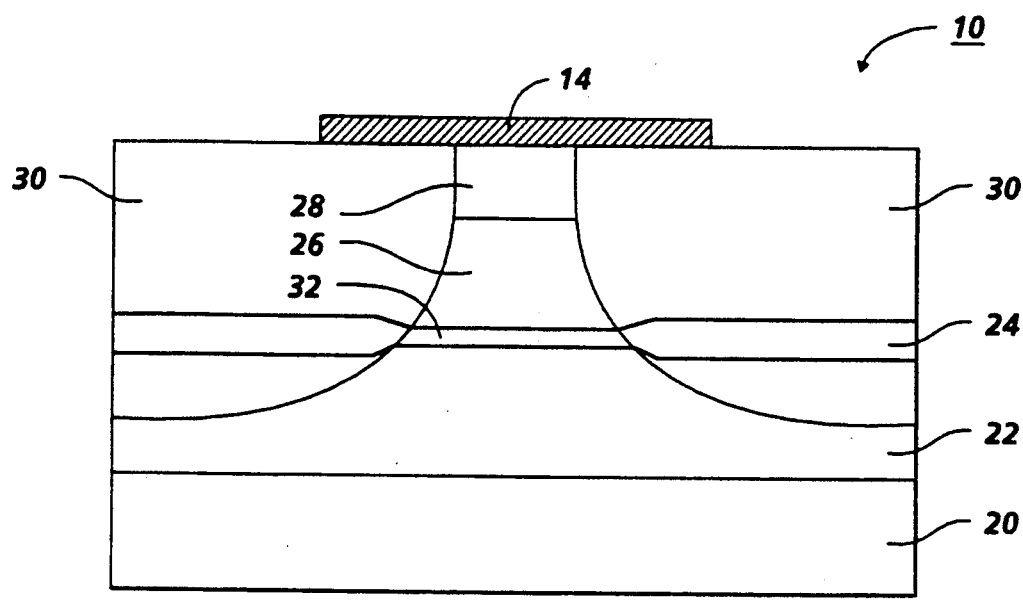
FIG. 3 is a schematic illustration of the cross-sectional end view of the semiconductor heterostructure with buried planar amplification optical waveguides and buried planar passive lowloss optical waveguides along the line 3—3 in FIG. 1 after selective impurity induced disordering formed according to the present invention.
Figure 4:
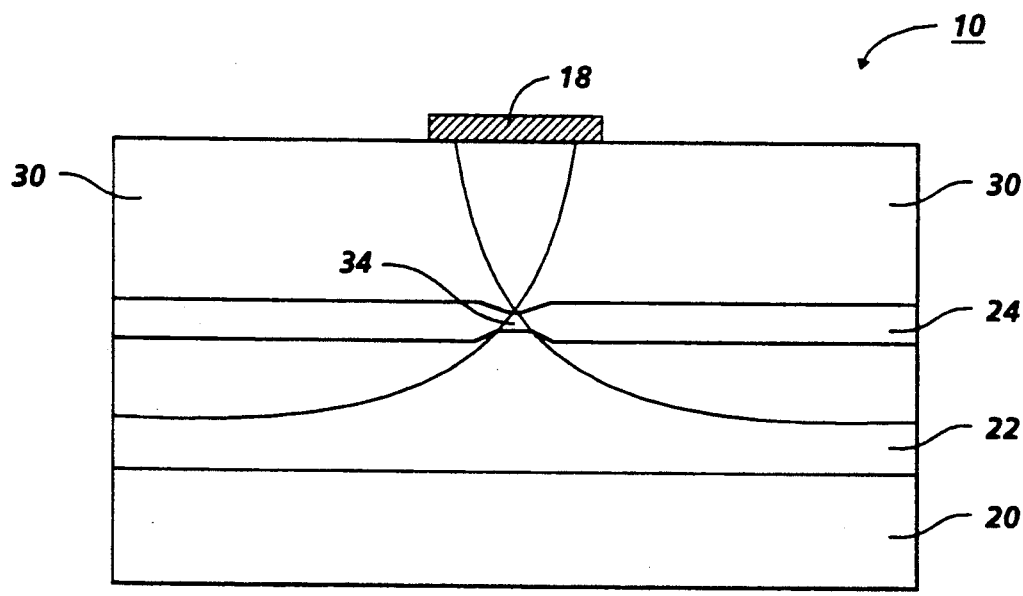
FIG. 4 is a schematic illustration of the cross-sectional end view of the semiconductor heterostructure with buried planar amplification optical waveguides and buried planar passive lowloss optical waveguides along the line 4—4 in FIG. 1 after selective impurity induced disordering formed according to the present invention.

The diffusion of silicon through and into the active layer 24, the cap layer 28 and the cladding layers 22 and 26 causes an intermixing of Ga and Al in the active layer 24, the cap layer 28 and the cladding layers 22 and 26, thereby forming a n-impurity induced disordered region 30, as shown in FIGS. 3 and 4.

FIG. 3 is the cross-sectional view of the semiconductor heterostructure along line 3—3 in FIG. 1. The larger mask 14 forms two separate disordered regions 30. Between the disordered regions 30 in the semiconductor heterostructure 10 are the remaining non-disordered regions of the cap layer 28, the second cladding layers 26, the active layer 24 and the first cladding layers 22. The non-disordered region of the active layer 24 between the disordered regions 30 in the semiconductor heterostructure 10 forms the amplification optical waveguide 32. The amplification optical waveguide is operated below the lasing threshold, i.e. lasing is suppressed by suppressing optical feedback between the mirrors at the facets. Without lasing, the amplification waveguide functions as an optical amplifier for input light when the amplification waveguide is forward biased. The disordered regions, optically and electrically, isolate and separate the amplification optical waveguide of the semiconductor heterostructure. The amplification optical waveguides are shaped by the cladding layers in the vertical direction and the shape of the disordered regions in the horizontal direction.

The mask 14 is removed from the semiconductor heterostructure 10 and contacts (not shown) can be formed on opposite sides of the heterostructure 10 on the cap layer 28 and the substrate 20. Standard masking means or other techniques can be employed to form metal contacts of Cr-Au or Ti-Pt-Au or Au/Ge.

Current is injected between the cap layer contact and the substrate contact to forward-bias the p-n junction of p-cladding layer 26 and n-cladding layer 22 to cause the amplification optical waveguide 32 to amplify input optical waves through stimulated emission. Current is applied by a controller when a signal is to be transmitted with amplification and not applied when the light beam is to be blocked. For example, a packet of information in the form of light pulses can include an address in its header which instructs a controller to turn on the optical waveguide if transmission through that channel is desired. The current is injected substantially perpendicular to the amplification optical waveguide 32, through the cap layer contact, the p-cap layer 28, the p-cladding layer 26, the amplification optical waveguide 32, and then spreads in the n-cladding layer 22 into the substrate 20 and out the substrate contact.

The ground or substrate contact can be common to more than one or even all the amplification optical waveguides. However, each amplification optical waveguide contains a p-n junction that is separately biased through its cap layer contact from all the others. Since each amplification optical waveguide is positively biased with respect to ground, current flows only from each cap layer contact to ground. The disordered regions prevent current from any single cap layer contact from leaking to an adjacent amplification waveguide and thereby affecting its optical gain. Current between different cap layer contacts does not occur because any small potential difference between the addressed cap layer contact and a neighboring cap layer contact corresponds to a reverse voltage on one of the lateral p-n junctions formed by the disordering. The disordered regions also prevent optical radiation fields in any amplification waveguide from leaking into an adjacent optical waveguide. Proton bombardment isolation is used to insure that current is injected from the cap contact 28 into only the nondisordered, as-grown amplification optical waveguide 32.

FIG. 4 is the cross-sectional view of the semiconductor heterostructure along line 4—4 in FIG. 1. The narrower mask 18 forms two overlapping disordered regions 30. The cap layer 28 and the second cladding layers 26 will be completely disordered with the disordered region 30 in the semiconductor heterostructure 10 encompassing the regions of the cap layer 28 and the second cladding layers 26. Between the disordered regions 30 in the semiconductor heterostructure 10 are the active layer 24 and the first cladding layer 22. The active layer will be initially or partially disordered. The partially disordered region of the active layer 24 between the disordered regions 30 in the semiconductor heterostructure 10 forms the passive optical waveguide 34 with a bandgap larger than the active layer. The disordered regions, optically and electrically, isolate and separate the passive optical waveguide of the semiconductor heterostructure. The passive optical waveguides are shaped by the disordered regions in the horizontal direction and the first cladding layer and the partially disordered second cladding layer in the vertical direction.

The mask 18 is removed from the semiconductor heterostructure 10 and no contacts are formed on opposite sides of the heterostructure 10 on the cap layer 28 and the substrate 20. The optical waveguides 34 are passive. The cap layer 28 above the passive waveguides can be proton bombarded to render this region insulating and therefore not electrically pumped. The initial or partial disordering of the active layer 24 will make the passive optical waveguide 34 transparent to radiation at any wavelength amplified by the amplification waveguide, i.e. the wavelength of the input light beam. Light propagated through the amplification waveguide will be smoothly transmitted through the passive waveguide.

The waveguiding strength of the passive waveguide 34 section of the active layer 24 of section 16 may be varied by changing the time of the impurity induced disordering and thereby fine tuning its refractive index properties for preferred model operation in the partially disordered active layer 24 of the passive waveguide 34. Index guiding due to change in the real index of refraction provides for optical confinement of the beam.

The diffraction and scattering losses within the two-dimensional passive optical waveguide are low. The propagation loss along the two-dimensional passive optical waveguide is also low due to its increased energy bandgap.

The passive waveguides 34 are unique in that they can be fabricated in a monolithic and planar fashion and provide subsurface passive optical waveguide structures that are easily made coplanar, coaxial and coupled with buried amplification waveguides. When forward-biased, the optical gain media of amplification waveguides can amplify signals to reduce the overall propagation loss of the total structure, to compensate for beam splitting, or to compensate for input coupling loss. When non-biased or reverse-biased, the optical gain media of the amplification waveguides absorb signals, thereby blocking their further transmission. Semiconductor structures incorporating these two dimensional passive waveguides permit the monolithic integration of optical and electronic components on a single chip.

A fuller description of one method for forming the index-guided amplification waveguides 32 and low-loss index-guided passive waveguides 34 is fully disclosed in U.S. Pat. No. 4,802,182 to Thornton et al. which is commonly assigned to the same assignee as the present application and is hereby incorporated by reference. There are also alternate diffusion/implant species for carrying out the desired disordering or alternate elemental implant/annealing techniques to form the waveguides. In addition, similar devices can also be realized with alternate fabrication technologies such as etch and regrowth or photo-assisted epitaxial growth and in other materials such as InP/GaInAsP, AlGaInP/GaAs, etc. These other techniques and elemental diffusions or implants are equally applicable.

The active layer in the index-guided amplification waveguides 32 and the passive waveguides 34 has a higher index of refraction than the neighboring areas of the disordered active layer 24 and a higher index of refraction than cladding layers 22 and 26. Thus, the light generated in the amplification waveguides 32 and transmitted by low-loss passive waveguides 34 is confined by the well-known phenomena of total internal reflection within the active layer 24 of the waveguides.

In index-guiding, confinement of the optical beam is produced by internal reflection from a change in the refractive index and it means that the wave propagates with a planar wavefront. By contrast, gain-guiding confines the optical beam by amplifying axial rays more than off-axis rays. Gain-guiding, by its nature, cannot be used to form a passive waveguide.

The passive waveguides 34 are integrally formed in the active medium and have an energy bandgap greater than the energy of the amplified lightwaves so that the coupling of the passive waveguide is nearly transparent to light from the amplification waveguides and does not need to be forward-biased to transmit the lightwaves. These transparent passive waveguides 34 can be narrower than the amplification waveguides 32. If the transparent passive waveguides 34 are sufficiently narrow they provide improved input/output coupling efficiency.

Multiple element switching or modulation can be obtained with a linear array of active elements. Each element in the array is constructed similar to a buried heterostructure or other index-guided diode laser. For some applications, gain-guided waveguides or combinations of a gain-guided and an index-guided waveguide may also be useful.

Figure 5:
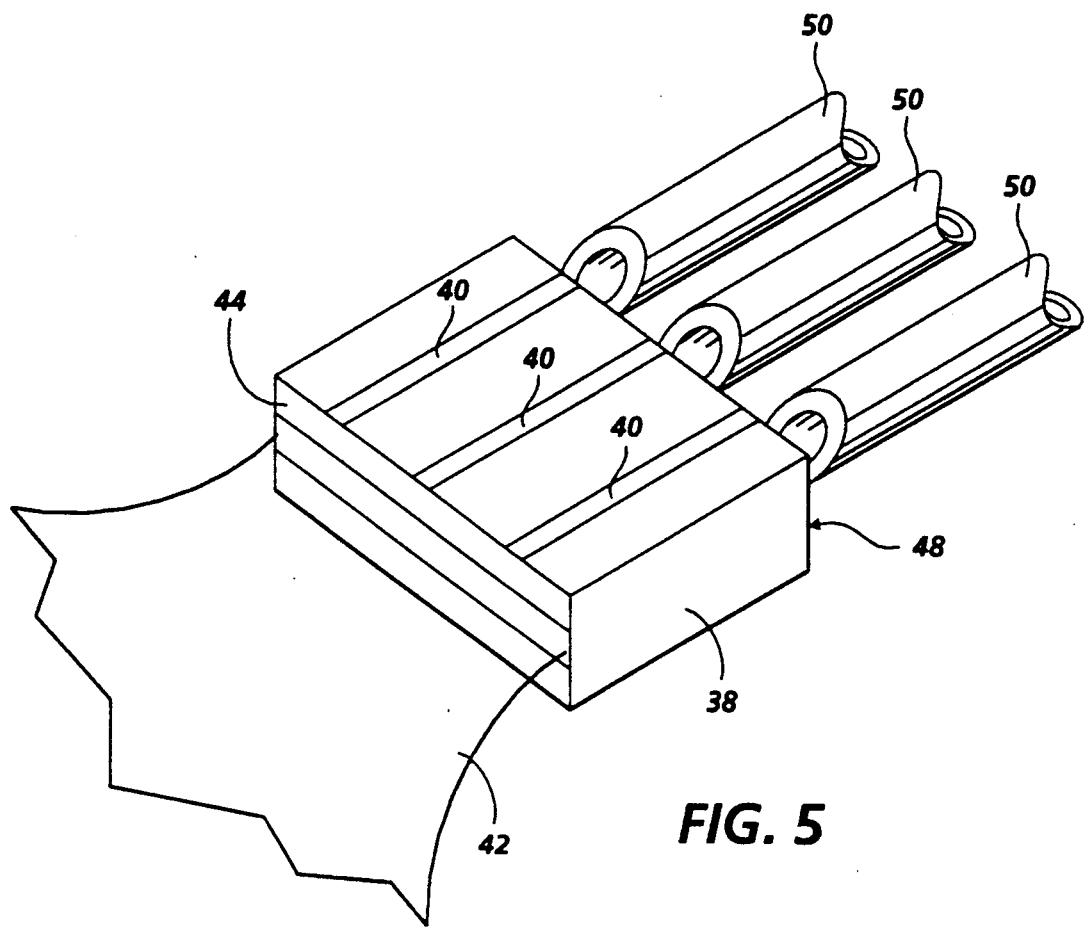
FIG. 5 is a schematic illustration of the perspective top view of the semiconductor heterostructure with a linear array of buried planar amplification optical waveguides for optical modulation and switching coupled to an input light beam and output optical fibers for the purpose of the present invention.

The semiconductor heterostructure 38 of FIG. 5 has a linear array of amplification gain-guided or index-guided waveguides 40. An input light beam 42 is incident upon the input facet 44 of the semiconductor heterostructure 38. The light beam is unguided. The light beam is focused in one direction to match the amplification waveguides 40 coupled to the input facet 44. The light beam is weakly focussed in the orthogonal direction to match the linear extent of the array.

The light is either transmitted or not transmitted through each amplification waveguide in the array. When operated at zero or reverse bias, the active region in each waveguide is highly absorptive, thereby producing the nontransmitting or off state of the switch. The transmitting or on state is obtained by forward biasing each active region with an appropriate current level. Each amplification waveguide has its own separately addressable contact, so that each amplification waveguide can be independently addressed to transmit light or not transmit light coupled into the waveguide. Thus, transmission of a portion of the light beam 42 into any one of the optical fibers 30 can be allowed or prevented, depending upon the externally programmed state of the appropriate one of the waveguides 40.

When transmitted to an optical fiber, the gain of the waveguide can be controlled by adjusting the level of the forward current applied in the on state thereby increasing the intensity of the transmitted light to compensate for losses incurred in other parts of the system.

The transmitted light from the array of amplification waveguides propagates through the output facet 48 of the semiconductor heterostructure 38. The output facet is coupled to the amplification waveguides within the semiconductor heterostructure and an array of fiber optics 50 outside the semiconductor heterostructure. The input facet and output facet are on opposing sides of the semiconductor heterostructure and perpendicular to the semiconductor layers, including the active layer in the heterostructure. The facets can be coated with an antireflective coating to increase transmission of the light and suppress optical feedback which causes lasing.

Semiconductor structure 38 can function as a multiple element optical switching array and/or a multiple element optical modulator. When operated as a switching array, any individual element is either forward-biased with a constant current to produce the transmitting or on state or nonbiased or reverse-biased with a constant voltage to produce the blocking or off state. This mode of operation is appropriate when the incident light beam carries information which is to be broadcast to one or more optical fibers. When the incident light beam does not carry information, each individual element can be switched from off to on, thereby impressing an information signal on the beam coupled to its optical fiber and functioning as a multiple element modulator. Furthermore, when an individual switch is in the on state, the bias current may be positively modulated to add information to the amplitude of the beam which may by already carrying information. In order that the information signals do not interfere, they must be capable of separation at the detector station, e.g. amplitude modulation at different carrier frequencies or amplitude modulation from the multiple element modulator impressed on a frequency modulated light beam.

The incident light beam 42 may be transmitted through a large core multimode fiber by tapering the end of the fiber into a nearly rectangular shape that more effectively matches the dimensions of the array of the amplification waveguides at the input facet.

Biasing any amplification waveguide in the array with zero or a reverse voltage causes light to be absorbed, thereby producing current in an external circuit. For this state, each amplification waveguide functions as a photodetector that can be used to monitor information signals contained in the intensity modulation of any light beam in the channel. Such signals can be used to adjust the gain in the on state to correct for nonuniform illumination or to detect the presence of specific beams whose intensities have been appropriately modulated. When an amplification waveguide is forward biased, variations in the input intensity will also produce variations in the output voltage at constant current that are small but similarly useful.

Figure 6:
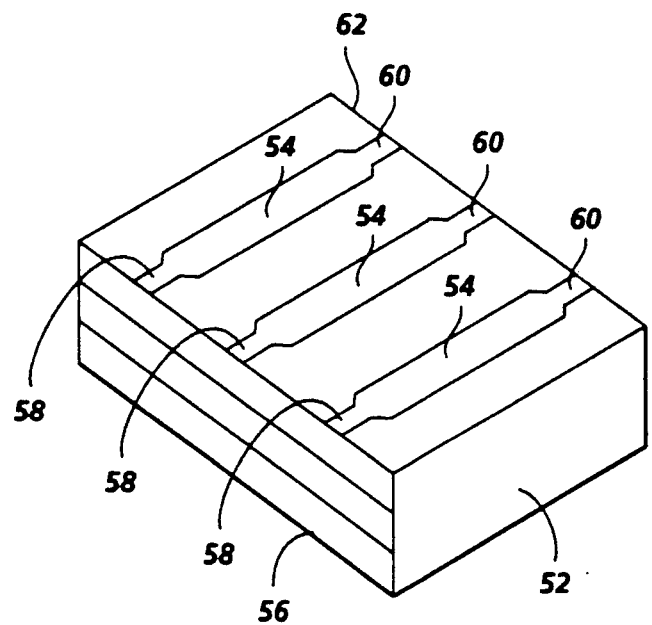
FIG. 6 is a schematic illustration of the perspective top view of the semiconductor heterostructure with a linear array of buried planar amplification optical waveguides coaxial and coupled to buried planar passive lowloss optical waveguides for optical modulation and switching formed according to the present invention.

Coupling of the input or output beam to the amplification waveguides in the array can be enhanced by using narrow transparent passive waveguides as shown in FIG. 6. The semiconductor heterostructure 52 of FIG. 6 has an array of amplification waveguides 54. The input facet 56 is coupled with a passive waveguide 58 which is coaxial and coupled to the amplification waveguide 54. The amplification waveguide 54 is also coaxial and coupled to another passive waveguide 60 which is coupled to the output facet 62. The amplification waveguide is thus coupled by passive waveguides to the input and output facets of the semiconductor heterostructure.

Because the mode in the passive waveguide is only weakly confined, it presents a larger cross-section to the incoming beam than the amplification waveguide. Similarly, the passive guide radiates with less divergence and thereby couples more effectively into an output fiber than the amplification waveguide with strong optical confinement.

The space between amplification waveguides in the array may be wide gap material, produced, for example, by the layer disordering used to form the individual waveguides. Consequently the intra-stripe regions will be transparent in the spectral region where the loss of the amplification waveguides can be electrically controlled. This transparency means that the intra-stripe space at the output facet of the array will emit unguided light as a background leakage. The contrast between the bright spots guided by the amplification waveguides and this unguided background can be kept adequately high by increasing the optical length of the array. Other designs in which inactive absorptive regions are located between the amplification waveguides of the array are also possible.

Either of the semiconductor heterostructures of FIGS. 5 and 6 can be used as multiple element print bars for xerographic printers. Current electro-optic modulators have individual pixels on 10 $\mu$m centers to obtain a resolution of 300 spi. This spi resolution corresponds to an optical magnification of 8.5. Since the semiconductor switches described in FIGS. 5 and 6 can easily be made on 5 $\mu$m centers, 600 spi resolution can be realized for current printer designs. With a 600 spi resolution, the total linear extent of the printbar would be 2.5 cm and so therefore on a single chip.

However, another approach is to change the optical magnification of the printer to allow a smaller semiconductor chip. For example, a 1 cm chip projected to 8.5 inches requires an optical magnification of 21.6. Thus, 300 spi resolution requires elements on 4 $\mu$m centers, which is realizable. However, since it is difficult to achieve the 2 μm spacing required to achieve 600 spi in this way, high resolution bars will very likely need to be made longer than 1 cm. Printbars with the multiple element switching arrays of FIGS. 5 and 6 have inherent intensity control since the on current can be used to finetune the output intensity of each element. Another advantage is that the control voltage on each element will not exceed ±10 volts, compared to the hundreds of volts needed to switch current electro-optic devices.

When the input beam is contained in a single mode optical fiber, an optical splitter is required to provide the fanout from one channel to the individual elements in the switching array.

Figure 7:
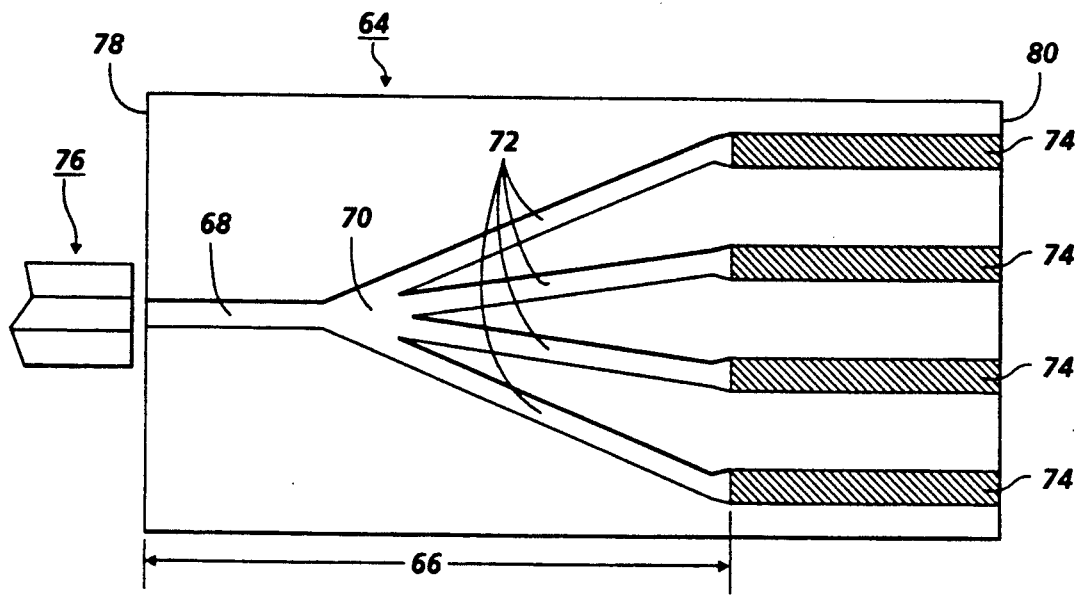
FIG. 7 is a schematic illustration of the cross-sectional top view of the semiconductor heterostructure with a buried planar optical splitter of a single passive lowloss optical waveguide into multiple passive lowloss optical waveguides coaxial and coupled to an array of amplification optical waveguides for optical modulation and switching formed according to the present invention.

The semiconductor heterostructure 64 of FIG. 7 has an optical splitter 66 in which a single passive waveguide 68 is split at one point 70 into multiple passive waveguides 72. Each of the multiple passive waveguides 72 is coaxial and coupled to an amplification waveguide 74 within an array of individually addressed amplification waveguides.

A single mode input optical fiber 76 is coupled to the input facet 78 of the semiconductor heterostructure 64 which is coupled to the passive waveguide 68. Input light is propagated through the single passive waveguide 68, split at point 70 into the multiple passive waveguides 72 and propagated to an array of individually addressed amplification waveguides 74. Biasing the amplification waveguides individually makes the semiconductor heterostructure 64 an optically switching array so that the transmitted light will be emitted through the output facet 80 coupled to the array of amplification waveguides. In the on state, amplification from the amplification waveguides is adjusted to compensate for splitting loss inherent in splitter 66. Light transmitted by each amplification waveguide is input to an individual optical fiber as shown in FIG. 5 or to an individual waveguide in another optical circuit.

Figure 8:
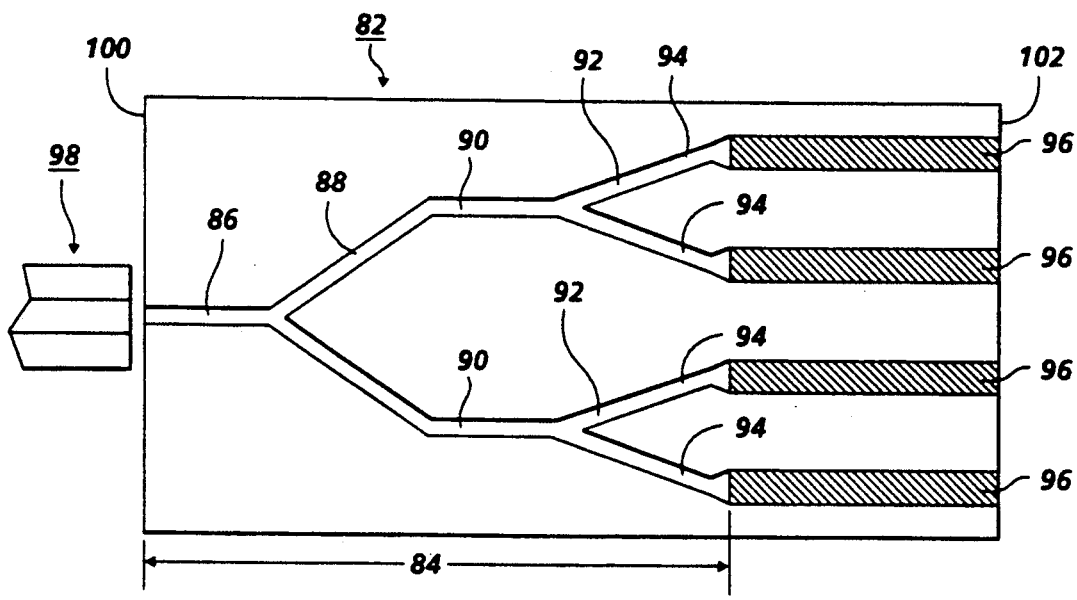
FIG. 8 is a schematic illustration of the cross-sectional top view of the semiconductor heterostructure with a buried planar optical splitter of a single passive lowloss optical waveguide through Y-couplers into multiple passive lowloss optical waveguides coaxial and coupled to an array of amplification optical waveguides for optical modulation and switching formed according to the present invention.

The semiconductor heterostructure 82 of FIG. 8 has an optical splitter 84 in which a single passive waveguide 86 is split by a Y-coupler 88 into two passive waveguides 90. Each passive waveguides 90 is in turn split by a Y-coupler 92 into two passive waveguides 94 for a total of four passive waveguides 94. Each of the multiple passive waveguides 94 is coaxial and coupled to an amplification waveguide 96 within an array of individually addressed amplification waveguides. The optical splitter 84 is thus a series or tree of coupled Y-couplers of passive waveguides.

A single mode input optical fiber 98 is coupled to the input facet 100 of the semiconductor heterostructure 82 which is coupled to the passive waveguide 86. Input light is propagated through the single passive waveguide 86, split by a Y-coupler 88 into two passive waveguides 90, further split by a Y-coupler 92 into passive waveguides 94. The passive waveguides 94 propagates the light to an array of individually addressed amplification waveguides 96. Biasing the amplification waveguides individually makes the semiconductor heterostructure 82 an optically switching array so that the transmitted light will be emitted through the output facet 102 coupled to the array of amplification waveguides. Light transmitted by each amplification waveguide is input to an individual optical fiber as shown in FIG. 5 or to an individual waveguide in another optical circuit.

Figure 9:
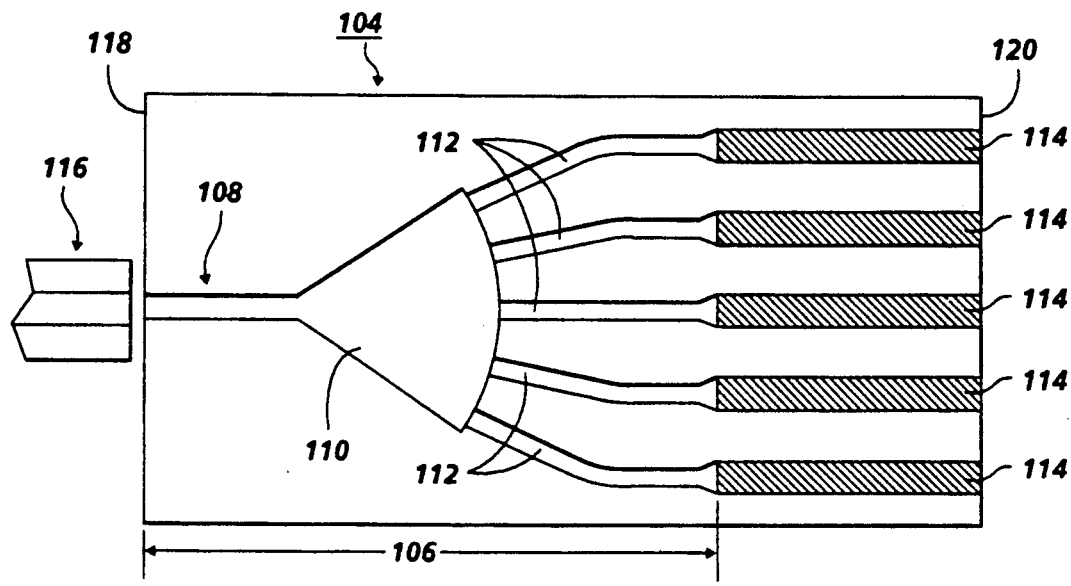
FIG. 9 is a schematic illustration of the cross-sectional top view of the semiconductor heterostructure with a buried planar optical splitter of a single passive lowloss optical waveguide through a horn arrangement into multiple passive lowloss optical waveguides coaxial and coupled to an array of amplification optical waveguides for optical modulation and switching formed according to the present invention.

The semiconductor heterostructure 104 of FIG. 9 has an optical splitter 106 in which a single passive waveguide 108 is split by a horn arrangement 110 into multiple passive waveguides 112. Each of the multiple passive waveguides 112 is coaxial and coupled to an amplification waveguide 114 within an array of individually addressed amplification waveguides.

The horn arrangement 110 is formed with wide bandgap material with vertical waveguiding such that the passive waveguides 112 are placed around a contour that matches the wavefront of the beam propagating within the horn arrangement. The horn structure is formed by partial disordering inside its boundaries in order to widen the bandgap of the active layer while maintaining vertical waveguiding.

A single mode input optical fiber 116 is coupled to the input facet 118 of the semiconductor heterostructure 104 which is coupled to the passive waveguide 108. Input light is propagated through the single passive waveguide 108, split by a horn arrangement 110 into the multiple passive waveguides 112 and propagated to an array of individually addressed amplification waveguides 114. Biasing the amplification waveguides individually makes the semiconductor heterostructure 104 an optically switching array so that the transmitted light will be emitted through the output facet 120 coupled to the array of amplification waveguides. Light transmitted by each amplification waveguide is input to an individual optical fiber as shown in FIG. 5 or to an individual waveguide in another optical circuit.

Figure 10:
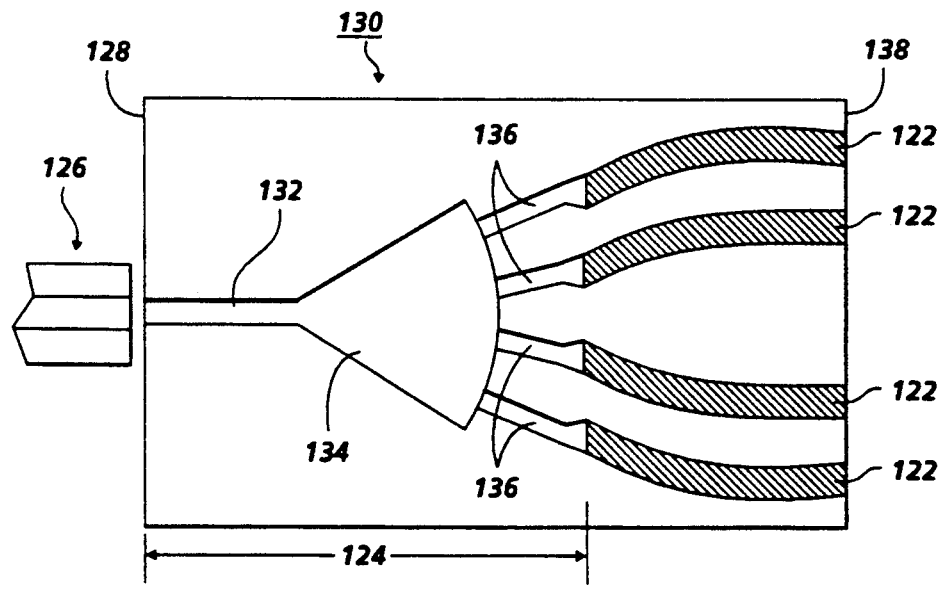
FIG. 10 is a schematic illustration of the cross-sectional top view of the semiconductor heterostructure with a buried planar optical splitter of a single passive lowloss optical waveguide through a horn arrangement into multiple passive lowloss optical waveguides coaxial and coupled to an array of curved amplification optical waveguides for optical modulation and switching formed according to the present invention.

The amplification waveguides 122 in FIG. 10 are curved to better receive the propagating light from the optical splitter 124. In this illustrative example, a single mode input optical fiber 126 is coupled to the input facet 128 of the semiconductor heterostructure 130 which is coupled to the passive waveguide 132. Input light is propagated through the single passive waveguide 132, split by a horn arrangement 134 into the multiple passive waveguides 136 and propagated to an array of individually addressed curved amplification waveguides 122. Biasing the amplification waveguides individually makes the semiconductor heterostructure 130 an optically switching array so that the transmitted light will be emitted through the output facet 138 coupled to the array of amplification waveguides. Light transmitted by each amplification waveguide is input to an individual optical fiber as shown in FIG. 5 or to an individual waveguide in another optical circuit. The curved amplification waveguides will also receive and propagate light from other optical splitters such as the single passive waveguide split at one point into multiple passive waveguides of FIG. 7 and the series or tree of coupled Y-couplers of passive waveguides of FIG. 8.

These arrangements in FIGS. 7, 8 and 10 can also be used in reverse as optical combiners to bring several beams back together after passing through the switching elements.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A semiconductor optical array comprising:
a monolithic semiconductor structure having a plurality of semiconductor heterostructure layers disposed over a substrate, at least one of said layers being an active layer for light amplification and propagation;

means, electrically coupled to said active layer, for applying an electrical forward bias to said active layer;

an input facet and an output facet disposed at opposing ends of said monolithic semiconductor structure, perpendicular to said plurality of semiconductor heterostructure layers and said active layer, said input facet receiving incident light waves and said output facet propagating transmitted light waves;

and a plurality of substantially parallel amplification waveguides, disposed in the active layer, with each of said amplification waveguides having a predetermined width, and having a first end terminating at said input facet and a second end terminating at said output facet for generating and amplifying light waves at a given wavelength in response to said electrical forward bias.

2. The semiconductor optical array of claim 1 wherein said means, electrically coupled to said active layer for applying an electrical forward bias to said active layer, are a plurality of independently addressable means corresponding in number to said amplification waveguides, one of said independently addressable means electrically coupled to each of said amplification waveguides for applying an electrical forward bias to said amplification waveguide and wherein said semiconductor optical array is an array of independently addressed optical switches.

3. The semiconductor optical array of claim 1 wherein said means, electrically coupled to said active layer for applying an electrical forward bias to said active layer, are a plurality of independently addressable means corresponding in number to said amplification waveguides, one of said independently addressable means electrically coupled to each of said amplification waveguides for applying an electrical forward bias to said amplification waveguide and wherein said semiconductor optical array is an array of independently addressed optical modulators.

4. A semiconductor optical array comprising:

a monolithic semiconductor structure having a plurality of semiconductor heterostructure layers disposed over a substrate, at least one of said layers being an active layer for light amplification and propagation;

means, electrically coupled to said active layer, for applying an electrical forward bias to said active layer;

an input facet and an output facet disposed at opposing ends of said monolithic semiconductor structure, perpendicular to said plurality of semiconductor heterostructure layers and said active layer, said input facet receiving incident light waves and said output facet propagating transmitted light waves;

a plurality of substantially parallel amplification waveguides, disposed in the active layer, with each of said amplification waveguides having a predetermined width for generating and amplifying light waves at a given wavelength in response to said electrical forward bias;

a first plurality of substantially parallel, low-loss, passive waveguides disposed in a first part of said active layer, each passive waveguide oriented co-axially to a corresponding amplification waveguide and co-extensively coupled at one end to said input facet and at the other end to said corresponding amplification waveguide for guiding lightwaves received in said input facet;

and a second plurality of substantially parallel, low-loss, passive waveguides disposed in a second part of said active layer, each passive waveguide oriented co-axially to a corresponding amplification waveguide and co-extensively coupled at one end to said corresponding amplification waveguide and at the other end to said output facet for guiding said amplified lightwaves generated in said corresponding coupled amplification waveguide to said output facet.

5. The semiconductor optical array of claim 4 wherein said means, electrically coupled to said active layer for applying an electrical forward bias to said active layer, are a plurality of independently addressable means corresponding in number to said amplification waveguides, one of said independently addressable means electrically coupled to each of said amplification waveguides for applying an electrical forward bias to said amplification waveguide and wherein said semiconductor optical array is an array of independently addressed optical switches.

6. The semiconductor optical array of claim 4 wherein said means, electrically coupled to said active layer for applying an electrical forward bias to said active layer, are a plurality of independently addressable means corresponding in number to said amplification waveguides, one of said independently addressable means electrically coupled to each of said amplification waveguides for applying an electrical forward bias to said amplification waveguide and wherein said semiconductor optical array is an array of independently addressed optical modulators.

7. The semiconductor optical array of claim 4 wherein said first and said second plurality of low-loss, passive waveguides have a second predetermined width substantially less than said predetermined width of said plurality of amplification waveguides to couple a different mode volume from said low-loss passive waveguides to said amplification waveguides.

8. A semiconductor optical array comprising:

a monolithic semiconductor structure having a plurality of semiconductor heterostructure layers disposed over a substrate, at least one of said layers being an active layer for light amplification and propagation;

means, electrically coupled to said active layer, for applying an electrical forward bias to said active layer;

an input facet and an output facet disposed at opposing ends of said monolithic semiconductor structure, perpendicular to said plurality of semiconductor heterostructure layers and said active layer, said input facet receiving incident light waves and said output facet propagating transmitted light waves;

a plurality of substantially parallel amplification waveguides, disposed in the active layer, with each of said amplification waveguides having a predetermined width and having an output end terminating at said output facet for generating and amplifying light waves at a given wavelength in response to said electrical forward bias;

a plurality of substantially parallel, low-loss, passive waveguides disposed in a first part of said active layer, said first plurality of said passive waveguides being less in number than said plurality of said amplification waveguides, each passive waveguide co-extensively coupled at one end to said input facet for guiding lightwaves received in said input facet;

and a plurality of optical splitters disposed in said active layer, each optical splitter oriented co-axially to a corresponding passive waveguide in said first plurality and oriented co-axially to at least two corresponding amplification waveguides and co-extensively coupled at one end to said passive waveguide in said first plurality and at the other end to said at least two corresponding amplification waveguides for guiding lightwaves propagated in said passive waveguide in said first plurality.

9. The semiconductor optical array of claim 8 wherein each of said optical splitters is a low-loss y-shaped coupler.

10. The semiconductor optical array of claim 9 wherein said semiconductor optical array is an optical combiner.

11. The semiconductor optical array of claim 8 wherein each of said optical splitters is a low-loss horn splitter.

12. The semiconductor optical array of claim 8 wherein said means, electrically coupled to said active layer for applying an electrical forward bias to said active layer, are a plurality of independently addressable means corresponding in number to said amplification waveguides, one of said independently addressable means electrically coupled to each of said amplification waveguides for applying an electrical forward bias to said amplification waveguide and wherein said semiconductor optical array is an array of independently addressed optical switches.

13. The semiconductor optical array of claim 8 wherein said means, electrically coupled to said active layer for applying an electrical forward bias to said active layer, are a plurality of independently addressable means corresponding in number to said amplification waveguides, one of said independently addressable means electrically coupled to each of said amplification waveguides for applying an electrical forward bias to said amplification waveguide and wherein said semiconductor optical array is an array of independently addressed optical modulators.

14. The semiconductor optical array of claim 8 wherein said semiconductor optical array is an optical combiner.

15. The semiconductor optical array of claim 8 wherein said plurality of low-loss, passive waveguides have a second predetermined width substantially less than said predetermined width of said plurality of amplification waveguides to couple a different mode volume from said low-loss passive waveguides to said amplification waveguides.

16. The semiconductor optical array of claim 8 wherein said amplification waveguides are curved to receive said lightwaves propagating from said optical splitters.

17. The semiconductor optical array of claim 8 further including
a second plurality of substantially parallel, low-loss, passive waveguides disposed in a second part of said active layer, each passive waveguide oriented co-axially to a corresponding amplification waveguide and co-extensively coupled at one end to said corresponding amplification waveguide and at the other end to said output facet for guiding said amplified lightwaves generated in said corresponding coupled amplification waveguide to said output facet.

18. The semiconductor optical array of claim 17 wherein said means, electrically coupled to said active layer for applying an electrical forward bias to said active layer, are a plurality of independently addressable means corresponding in number to said amplification waveguides, one of said independently addressable means electrically coupled to each of said amplification waveguides for applying an electrical forward bias to said amplification waveguide and wherein said semiconductor optical array is an array of independently addressed optical switches.

19. The semiconductor optical array of claim 17 wherein said means, electrically coupled to said active layer for applying an electrical forward bias to said active layer, are a plurality of independently addressable means corresponding in number to said amplification waveguides, one of said independently addressable means electrically coupled to each of said amplification waveguides for applying an electrical forward bias to said amplification waveguide and wherein said semiconductor optical array is an array of independently addressed optical modulators.

20. The semiconductor optical array of claim 17 wherein each of said optical splitters is a low-loss y-shaped coupler.

21. The semiconductor optical array of claim 20 wherein said semiconductor optical array is an optical combiner.

22. The semiconductor optical array of claim 17 wherein each of said optical splitters is a low-loss horn splitter.

23. The semiconductor optical array of claim 17 wherein said first and said second plurality of low-loss, passive waveguides have a second predetermined width substantially less than said predetermined width of said plurality of amplification waveguides to couple a different mode volume from said low-loss passive waveguides to said amplification waveguides.

24. The semiconductor optical array of claim 17 wherein said amplification waveguides are curved to receive said lightwaves propagating from said optical splitters.

* * * * *